United States Patent
Hon

(10) Patent No.: US 8,546,156 B2
(45) Date of Patent: Oct. 1, 2013

(54) HIGH EFFICIENCY LIGHT-EMITTING DIODE AND METHOD FOR MANUFACTURING THE SAME

(75) Inventor: Schang-Jing Hon, Tainan (TW)

(73) Assignee: Epistar Corporation, Hsinchu (TW)

( * ) Notice: Subject to any disclaimer, the term of this patent is extended or adjusted under 35 U.S.C. 154(b) by 217 days.

(21) Appl. No.: 12/875,651

(22) Filed: Sep. 3, 2010

(65) Prior Publication Data
US 2011/0003415 A1 Jan. 6, 2011

Related U.S. Application Data

(63) Continuation of application No. 11/687,874, filed on Mar. 19, 2007, now Pat. No. 7,811,838.

(30) Foreign Application Priority Data

Dec. 29, 2006 (TW) .............................. 95150033 A

(51) Int. Cl.
*H01L 21/00* (2006.01)
(52) U.S. Cl.
USPC ................... 438/22; 438/23; 438/24; 438/29; 257/E33.032; 257/E33.068
(58) Field of Classification Search
USPC ...................... 257/79, 97–98; 438/22–24, 29
See application file for complete search history.

(56) References Cited

U.S. PATENT DOCUMENTS

| 5,376,580 | A | 12/1994 | Kish et al. | |
|---|---|---|---|---|
| 6,869,820 | B2 * | 3/2005 | Chen | 438/79 |
| 2002/0185648 | A1 | 12/2002 | Furukawa et al. | |
| 2003/0111667 | A1 | 6/2003 | Schubert | |
| 2003/0164503 | A1 | 9/2003 | Chen | |
| 2005/0001226 | A1 * | 1/2005 | Chen | 257/98 |
| 2008/0157107 | A1 * | 7/2008 | Shei et al. | 257/97 |

FOREIGN PATENT DOCUMENTS

| CN | 2665934 | | 12/2004 |
|---|---|---|---|
| TW | 224874 | * | 12/2004 |

OTHER PUBLICATIONS

Hsieh et al (Dec. 1, 2004).*

* cited by examiner

*Primary Examiner* — A. Sefer
(74) *Attorney, Agent, or Firm* — Muncy, Geissler, Olds & Lowe, PLLC

(57) ABSTRACT

A high efficiency light-emitting diode and a method for manufacturing the same are described. The high efficiency light-emitting diode comprises: a permanent substrate; a first contact metal layer and a second contact metal layer respectively deposed on two opposite surfaces of the permanent substrate; a bonding layer deposed on the second contact metal layer; a diffusion barrier layer deposed on the bonding layer, wherein the permanent substrate, the bonding layer and the diffusion barrier layer are electrically conductive; a reflective metal layer deposed on the diffusion barrier layer; a transparent conductive oxide layer deposed on the reflective metal layer; an illuminant epitaxial structure deposed on the transparent conductive oxide layer, wherein the illuminant epitaxial structure includes a first surface and a second surface opposite to the first surface; and a second conductivity type compound electrode pad deposed on the second surface of the illuminant epitaxial structure.

18 Claims, 6 Drawing Sheets

HIGH EFFICIENCY LIGHT-EMITTING DIODE AND METHOD FOR MANUFACTURING THE SAME

RELATED APPLICATIONS

This application is a continuation application of, and claims priority from, U.S. patent application Ser. No. 11/687,874, filed Mar. 19, 2007 now U.S. Pat. No. 7,811,838, which is based on, and claims priority from, Taiwan Application Serial Number 95150033, filed Dec. 29, 2006, the disclosure of which is hereby incorporated by reference herein in its entirety.

FIELD OF THE INVENTION

The present invention relates to a light-emitting diode (LED) and a method for manufacturing the same, and more particularly, to a high efficiency light-emitting diode and a method for manufacturing the same.

BACKGROUND OF THE INVENTION

In the fabrication of light-emitting diodes, group III-V compound semiconductors, such as GaP, GaAsP, GaInP, AlGaAs, AlGaP and AlGaInP, are common. Typically, a material of a growth substrate of a conventional light-emitting diode adopts N-type gallium arsenide (GaAs). The growth substrate composed of N-type GaAs can absorb light, so that most of the photons produced by the active layer of the light-emitting diode while being emitted towards the growth substrate are absorbed by the growth substrate, thus seriously affecting the light emitting efficiency of the light-emitting diode device.

In order to prevent light being absorbed by the substrate, a method that directly bonds the GaAs light-emitting diode wafer to the silicon (Si) substrate after the GaAs light-emitting diode wafer is stripped off the GaAs substrate has been developed. Additionally, the U.S. Pat. No. 5,376,580 (application date: Mar. 19, 1993) filed by Hewlett-Packard Co., U.S.A. disclosed a technology about directly bonding the AlGaAs light-emitting diode wafer to the other substrate after the AlGaAs light-emitting diode wafer is stripped off the GaAs substrate. However, the disadvantages of the U.S. Pat. No. 5,376,580 include processing difficulties and low yields caused by the need to consider the consistency of the lattice direction between the bonding wafers, since the bonding mediums are semiconductors.

In the conventional bonding process, a bonding step has to be performed first, and processes of an illuminant epitaxial structure and a permanent substrate are performed, so that the bonding temperature is limited to a value larger than the process temperature of the illuminant epitaxial structure. Under higher bonding temperature, the material of an adhesive layer must adopt materials with higher melting points and larger hardness, so that degradation in the operating of the light-emitting diode easily occurs.

Further, in order to improve the current-spreading effect of a light-emitting diode, a typical design is to increase the area of electrodes. However, the electrodes are opaque, so that increasing of the area of the electrodes results in increasing the opaque area, thereby decreasing brightness of the light-emitting diode.

SUMMARY OF THE INVENTION

One aspect of the present invention is to provide a high efficiency light-emitting diode, in which no high temperature process is performed after the bonding of an illuminant epitaxial structure and a permanent substrate, so that the selectiveness of the bonding material is increased, thereby providing easier process conditions, broadening the process window of the bonding process and effectively enhancing the reliability of the light-emitting diode.

Another aspect of the present invention is to provide a high efficiency light-emitting diode, which has a P-side up illuminant epitaxial structure, so that a transparent current-spreading layer with a larger thickness and higher electrical conductivity can be epitaxially grown. Accordingly, light extraction efficiency is increased, the current-spreading effect is improved, and the area of the opaque electrodes is decreased, thereby enhancing brightness of the light-emitting diode.

Still another aspect of the present invention is to provide a high efficiency light-emitting diode, in which silicon may be adopted as a material of a permanent substrate. Because silicon has properties of high thermal conductivity, high electrical conductivity, being easily processed, and superior reliability operated under large current, operation performance of the light-emitting diode is effectively enhanced.

Yet another aspect of the present invention is to provide a method for manufacturing a high efficiency light-emitting diode, which can provide easier process conductions, so that reliability of the light-emitting diode is further enhanced.

According to the aforementioned aspects, the present invention provides a high efficiency light-emitting diode, comprising: a permanent substrate including a first surface and a second surface on opposite sides, wherein the permanent substrate is electrically conductive; a first contact metal layer and a second contact metal layer respectively deposed on the first surface and the second surface of the permanent substrate; a bonding layer deposed on the second contact metal layer, wherein the bonding layer is electrically conductive; a reflective contact structure deposed on the bonding layer; an illuminant epitaxial structure deposed on the reflective contact structure, wherein the illuminant epitaxial structure includes a first surface and a second surface on opposite sides, the illuminant epitaxial structure comprises a first conductivity type cladding layer, an active layer, a second conductivity type cladding layer and a transparent current-spreading layer stacked in sequence, and the first conductivity type cladding layer and the second conductivity type cladding layer are different conductivity types; and a second conductivity type compound electrode pad deposed on a portion of the second surface of the illuminant epitaxial structure.

According to a preferred embodiment of the present invention, the bonding layer is composed of an adhesive layer, and a material of the adhesive layer is preferably PbSn, AuGe, AuBe, AuSn, Sn, In or PdIn. According to another preferred embodiment of the present invention, a material of the permanent substrate is preferably Si, Ge, SiC, AlN, Cu or Al for electrical conduction.

According to the aforementioned aspects, the present invention further provides a method for manufacturing a high efficiency light-emitting diode, comprising: providing a growth substrate; forming an etching stop layer on the growth substrate; forming a first conductivity type ohmic contact layer on the etching stop layer; forming an illuminant epitaxial structure on a surface of the first conductivity type ohmic contact layer, wherein the illuminant epitaxial structure includes a first surface and a second surface on opposite sides, and the first surface of the illuminant epitaxial structure is directly connected with the surface of the first conductivity type ohmic contact layer; forming a second conductivity type compound electrode pad on a portion of the second surface of the illuminant epitaxial structure; providing a temporary substrate; bonding the temporary substrate to the illuminant epitaxial structure and the second conductivity type compound electrode pad by using a first bonding layer, wherein the first bonding layer is sandwiched in between the temporary substrate and the second surface of the illuminant epitaxial structure; removing the growth substrate to expose the etching stop layer; removing the etching stop layer to expose the first conductivity type ohmic contact layer; providing a permanent substrate; bonding the permanent substrate to the exposed first conductivity type ohmic contact layer by using a second bonding layer, wherein the second bonding layer is sandwiched in between the permanent substrate and the first conductivity type ohmic contact layer; and removing the temporary substrate and the first bonding layer.

According to a preferred embodiment of the present invention, the second bonding layer is composed of a second adhesive layer, and a material of the second adhesive layer is preferably PbSn, AuGe, AuBe, AuSn, Sn, In or PdIn. According to another preferred embodiment of the present invention, a material of the permanent substrate is preferably Si, Ge, SiC, AlN, Cu or Al for electrical conduction.

BRIEF DESCRIPTION OF THE DRAWINGS

The foregoing aspects and many of the attendant advantages of this invention are more readily appreciated as the same become better understood by reference to the following detailed description, when taken in conjunction with the accompanying drawings, wherein.

DETAILED DESCRIPTION OF THE PREFERRED EMBODIMENT

The present invention discloses a high efficiency light-emitting diode and a method for manufacturing the same, which can enhance the brightness of the light-emitting diode and can increase the operation reliability and stability of the light-emitting diode. In order to make the illustration of the present invention more explicit, the following description is stated with reference to FIG. 1 through FIG. 8.

Figure 1:
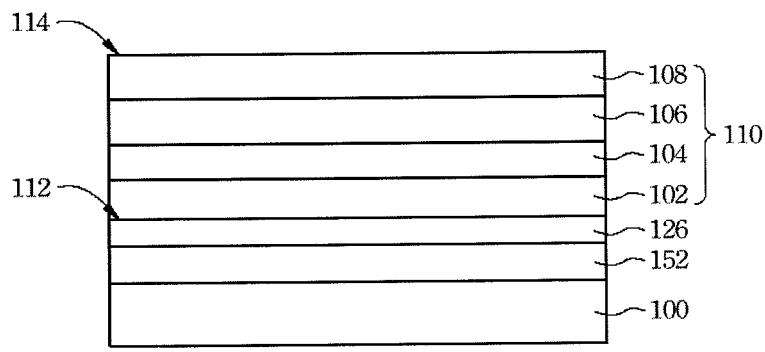
FIG. 1 through FIG. 8 are schematic flow diagrams showing the process for manufacturing a high efficiency light-emitting diode in accordance with a preferred embodiment of the present invention.

FIG. 1 through FIG. 8 are schematic flow diagrams showing the high efficiency light-emitting diode manufacturing process in accordance with a preferred embodiment of the present invention. In an exemplary embodiment of the present invention, in the fabrication of a light-emitting diode device, a growth substrate 100 is provided, and an etching stop layer 152 is directly grown on a surface of the growth substrate 100 by, for example, a deposition method. A first conductivity type ohmic contact layer 126 is formed on the etching stop layer 152, wherein a material of the first conductivity type ohmic contact layer 126 may be GaAs, GaAsP or AlGaInP. An illuminant epitaxial structure 110 is grown on the first conductivity type ohmic contact layer 126 by, for example, a metal organic chemical vapor deposition (MOCVD) method, a liquid phase deposition (LPD) method or a molecular beam epitaxy (MBE) method. In one embodiment, the illuminant epitaxial structure 110 comprises a first conductivity type cladding layer 102, an active layer 104, a second conductivity type cladding layer 106 and a transparent current-spreading layer 108 grown and stacked on a surface of the first conductivity type ohmic contact layer 126 in sequence, such as shown in FIG. 1. The illuminant epitaxial structure 110 has a surface 112 and a surface 114 on two opposite sides, wherein the surface 112 of the illuminant epitaxial structure 110 is directly connected with the surface of the first conductivity type ohmic contact layer 126, and the surface 114 of the illuminant epitaxial structure 110 is exposed. In the invention, the first conductivity type and the second conductivity type are different conductivity types. In the present exemplary embodiment, the first conductivity type is N-type, and the second conductivity type is P-type to produce a P-side up light-emitting diode structure. A material of the growth substrate 100 is preferably a group III-V compound semiconductor material, such as GaAs, InP, GaP or sapphire. A material of the first conductivity type cladding layer 102 may be $Al_xGa_{1-x}As$ (x>0.4) or $(Al_xGa_{1-x})_yIn_{1-y}P$ (x>0.4). A material of the second conductivity type cladding layer 106 may be $Al_xGa_{1-x}As$ (x>0.4) or $(Al_xGa_{1-x})_yIn_{1-y}P$ (x>0.4). A material of the active layer 104 may be $(Al_xGa_{1-x})_yIn_{1-y}P$ (x<0.5). A material of the transparent current-spreading layer 108 may be GaP, GaAsP, AlGaAs or AlGaInP.

Figure 2:
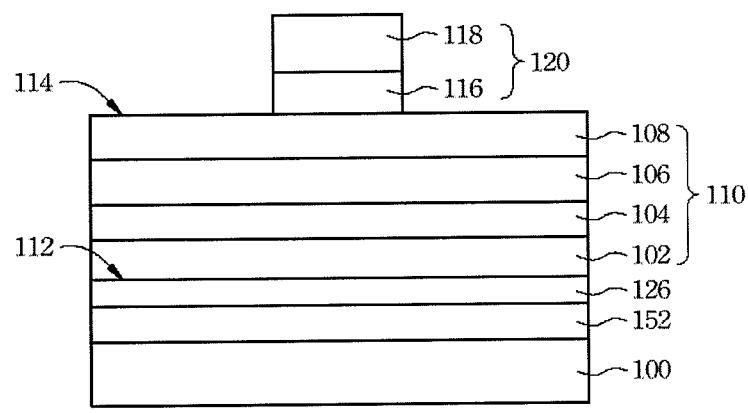

After the formation of the illuminant epitaxial structure 110 is completed, a second conductivity type compound electrode pad 120 is formed on a portion region of the surface 114 of the illuminant epitaxial structure 110 for the light-emitting diode to electrically connected to an outer circuit. In the present exemplary embodiment, the second conductivity type compound electrode pad 120 comprises an ohmic contact metal layer 116 and a bonding metal pad 118 stacked on the surface 114 of the illuminant epitaxial structure 110 in sequence, such as shown in FIG. 2. A material of the ohmic contact metal layer 116 may be AuBe, AuZn or CrAu. A material of the bonding metal pad 118 may be Au or Al.

Figure 3:
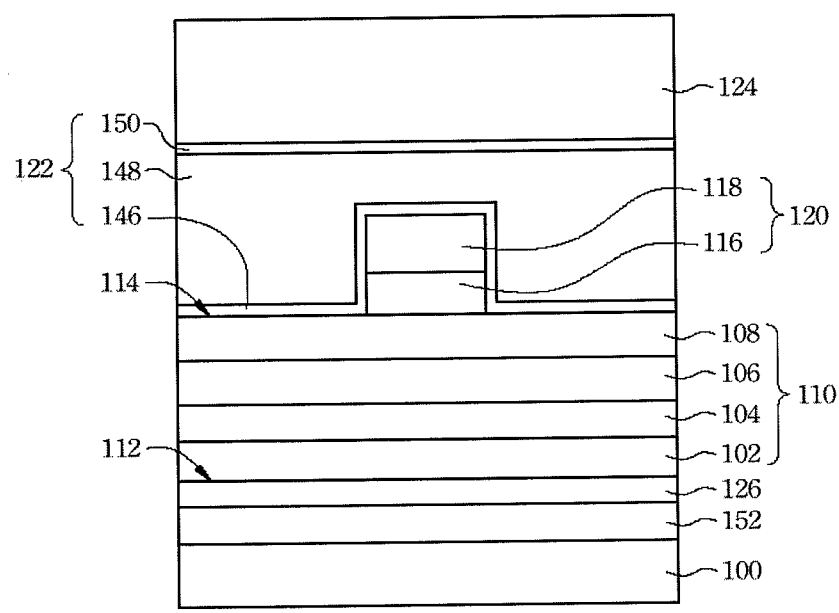

Next, a temporary substrate 124 is bonded to the illuminant epitaxial structure 110 and the second conductivity type compound electrode pad 120 by using a bonding layer 122. After bonding, the bonding layer 122 is sandwiched between the temporary substrate 124 and the surface 114 of the illuminant epitaxial structure 110, such as shown in FIG. 3. In the bonding step of the temporary substrate 124, the bonding layer 122 is first coated on the exposed portion of the surface 114 of the illuminant epitaxial structure 110 and the second conductivity type compound electrode pad 120, and then the temporary substrate 124 is adhered to the bonding layer 122. In another embodiment, in the bonding step of the temporary substrate 124, the bonding layer 122 is first coated on a surface of the temporary substrate 124, and then the bonding layer 122 is adhered to the surface 114 of the illuminant epitaxial structure 110 and the second conductivity type compound electrode pad 120 to complete the bonding of the temporary substrate 124 and the illuminant epitaxial structure 110. When the temporary substrate 124 is bonded, the bonding temperature is preferably controlled between about 150° C. and about 500° C. The bonding layer 122 preferably comprises a protection layer 146, a protection layer 150 and an adhesive layer 148, wherein the adhesive layer 148 is sandwiched between the protection layer 146 and the protection layer 150, and the protection layer 150 is located between the protection layer 146 and the temporary substrate 124. Materials of the protection layer 146 and the protection layer 150 may be $SiO_2$, $Si_3N_4$, Ni, Cr, spin on glass (SOG) coating photoresist, $Al_2O_3$, MgO or ZnO. A material of the adhesive layer 148 may be PbSn, AuGe, AuBe, AuSn, Sn, In, PdIn, BCB, epoxy, Si, PI or spin on glass coating polymer. The temporary substrate 124 is preferably composed of an easily fabricate, low cost material and is different from that of a permanent substrate 138 (referring to FIG. 6), such as glass, Si, GaAs, Cu or Al.

Figure 4:
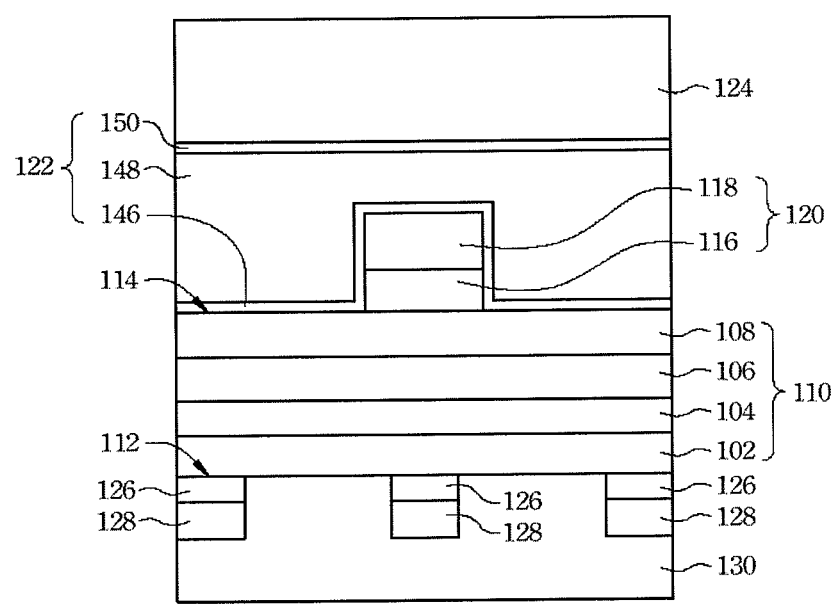

Then, the growth substrate 100 is removed to expose the etching stop layer 152 by, for example, a chemical etching method or a polishing method. The etching stop layer 152 is removed to expose the first conductivity type ohmic contact layer 126 by, for example, a chemical etching method or a polishing method. Next, the first conductivity type ohmic contact layer 126 is patterned to expose a portion of the surface 112 of the illuminant epitaxial structure 110. A first conductivity type ohmic contact metal layer 128 is formed to stack on the first conductivity type ohmic contact layer 126 to improve the electrical quality of the light-emitting diode. A material of the first conductivity type ohmic contact metal layer 128 may be a compound material, such as AuGe/Au, Au/AuGe/Au or AuGe/Ni/Au. A transparent conductive oxide layer 130 is formed to cover the first conductivity type ohmic contact layer 126, the first conductivity type ohmic contact metal layer 128 and the exposed portion of the surface 112 of the illuminant epitaxial structure 110. A material of the transparent conductive oxide layer 130 may be $In_2O_3$, $SnO_2$, ZnO, ITO, CTO, $CuAlO_2$, $CuGaO_2$ or $SrCu_2O_2$. Then, such as shown in FIG. 4, a reflective metal layer 132 is formed to cover the transparent conductive oxide layer 130 to reflect the light emitted by the active layer 106 towards the reflective metal layer 132. A material of the reflective metal layer 132 may be Au, Al, Ag, Cr or Ni. The reflective metal layer 132, the transparent conductive oxide layer 130, the first conductivity type ohmic contact layer 126 and the first conductivity type ohmic contact metal layer 128 comprise a reflective contact structure. Then, the reflective metal layer 132 may be directly bonded with a permanent substrate 138; or other additional processes of the illuminant epitaxial structure 110 and the permanent substrate 138 may be selectively performed, and then the bonding process of the illuminant epitaxial structure 110 and the permanent substrate 138 is performed.

Figure 5:
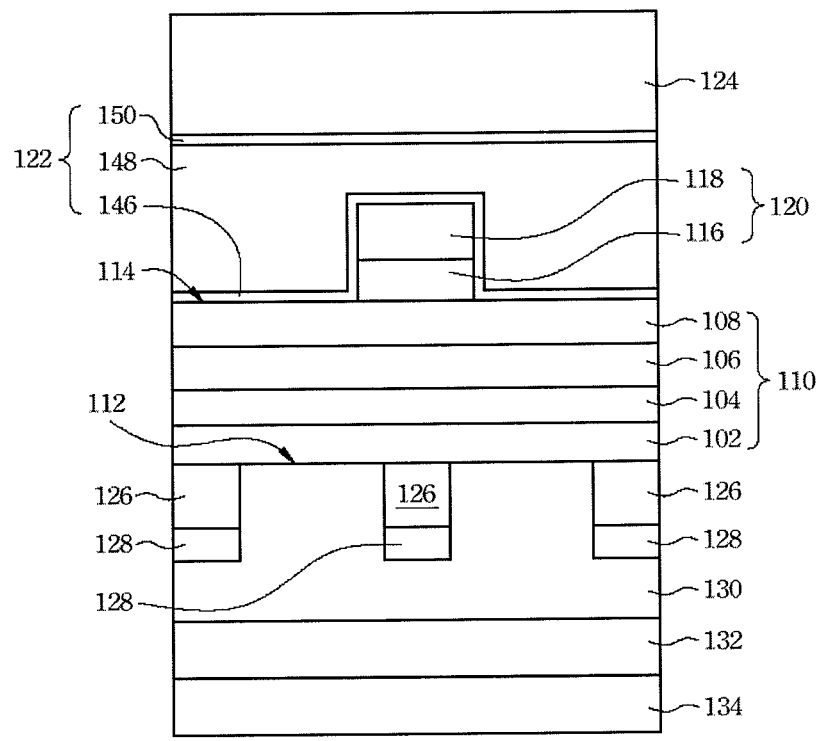

In the present exemplary embodiment, additional processes are performed first on the illuminant epitaxial structure 110 and the permanent substrate 138, and then the bonding process of the illuminant epitaxial structure 110 and the permanent substrate 138 is performed. Referring to FIG. 5, after the reflective metal layer 132 is formed, a diffusion barrier layer 134 is formed to cover the reflective metal layer 132. A material of the diffusion barrier layer 134 may be Mo, Pt, W, ITO, ZnO or MnO.

Figure 6:
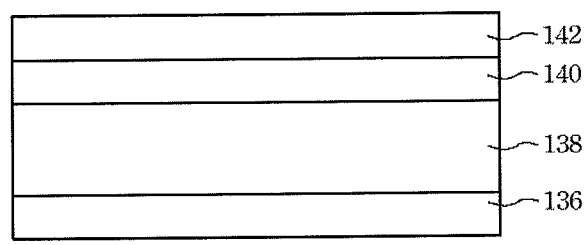
Figure 7:
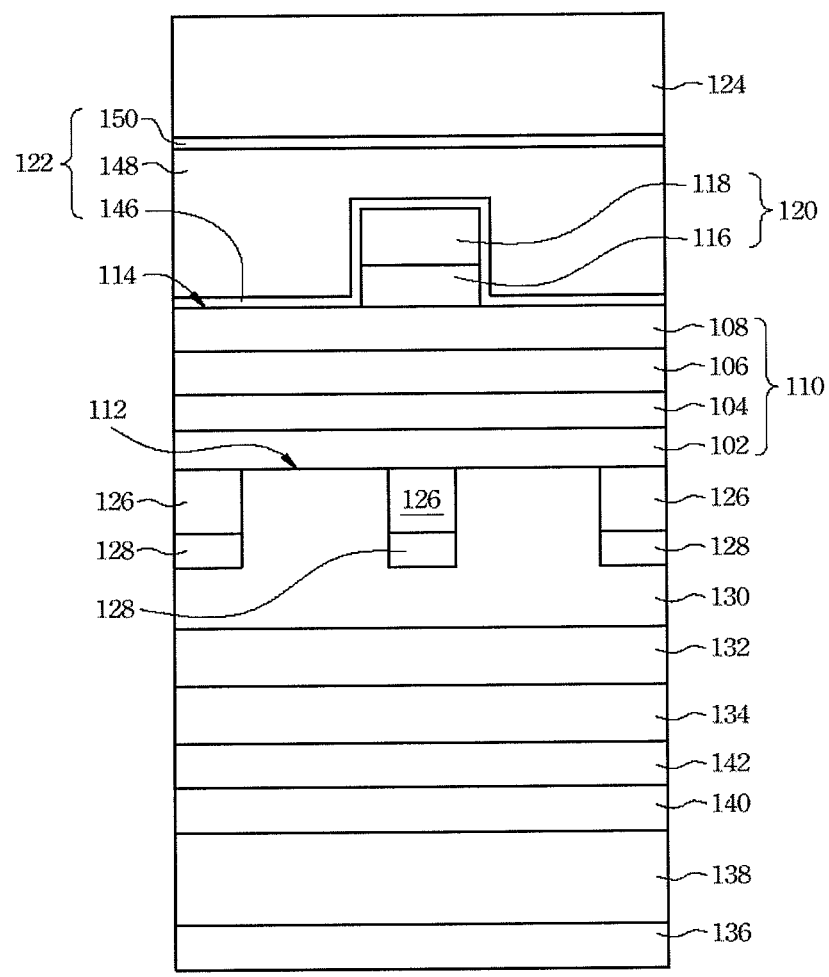

In the meanwhile, the permanent substrate 138 is provided, wherein a material of the permanent substrate 138 may be Si, Ge, SiC, AlN, Cu, Al or sapphire. Selectively, a contact metal layer 136 and a contact metal layer 140 are respectively formed on opposite surfaces of the permanent substrate 138 to improve the electrical contact quality. In the present exemplary embodiment, when the permanent substrate 138 is bonded, a bonding layer 142 is firstly coated on the contact metal layer 140 on the permanent substrate 138, such as shown in FIG. 6, and then the bonding layer 142 is adhered to the diffusion barrier layer 134 under the surface 112 of the illuminant epitaxial structure 110 to complete the bonding of the permanent substrate 138 and the illuminant epitaxial structure 110, such as shown in FIG. 7. In another embodiment, when the permanent substrate 138 is bonded, the bonding layer 142 may be firstly coated on the diffusion barrier layer 134 under the surface 112 of the illuminant epitaxial structure 110, and then the contact metal layer 140 on the permanent substrate 138 is adhered to the bonding layer 142 to successfully complete the bonding of the permanent substrate 138 and the illuminant epitaxial structure 110. When the permanent substrate 138 is bonded, the bonding temperature is preferably controlled between about 150° C. and about 500° C. The bonding layer 142 preferably comprises an adhesive layer, and a material of the adhesive layer may be PbSn, AuGe, AuBe, AuSn, Sn, In, PdIn or Si.

Figure 8:
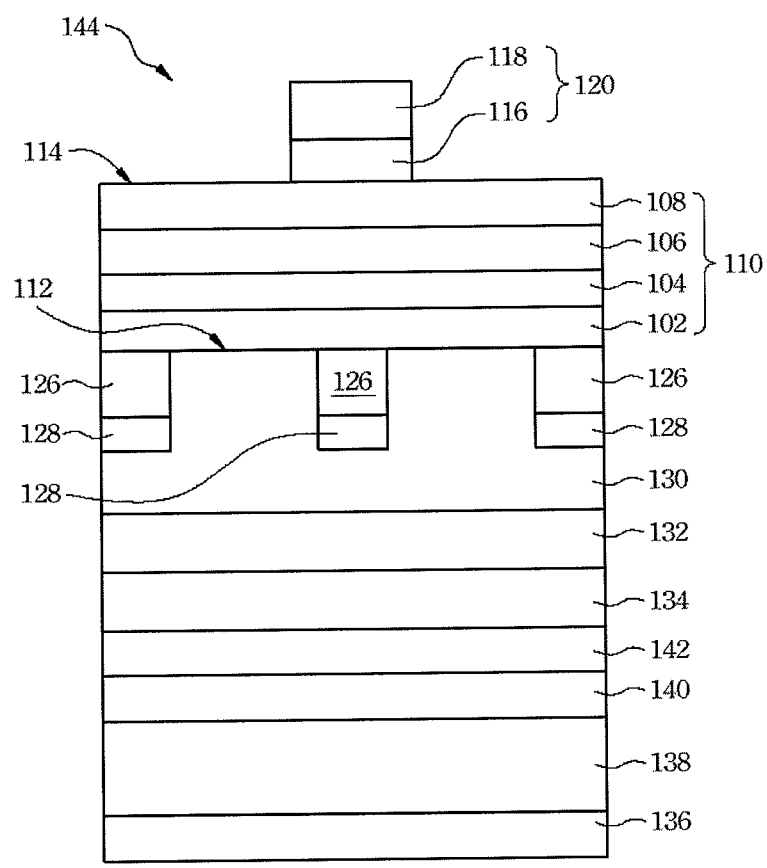

After the bonding of the permanent substrate 138 and the illuminant epitaxial structure 110, the temporary substrate 124 and the bonding layer 122 are removed by an etching method, such as a chemical etching method, to expose the surface 114 of the illuminant epitaxial structure 110 and the second conductivity type compound electrode pad 120, so as to complete the fabrication of a light-emitting diode 144, such as shown in FIG. 8.

According to the aforementioned description, there is no high temperature process being performed after the bonding of an illuminant epitaxial structure and a permanent substrate in an exemplary embodiment of the present invention, so that the selectiveness of the bonding material is increased, thereby providing easier process conditions, broadening the process window of the bonding process and effectively enhancing the reliability of the light-emitting diode.

According to the aforementioned description, the high efficiency light-emitting diode in an exemplary embodiment of the present invention has a P-side up illuminant epitaxial structure, so that a transparent current-spreading layer having a larger thickness and higher electrical conductivity can be epitaxially grown. Therefore, light extraction efficiency of the light-emitting diode is increased, the current-spreading effect is improved, and the area of the opaque electrodes is decreased, thereby enhancing brightness of the light-emitting diode.

According to the aforementioned description, because silicon may be adopted as a material of a permanent substrate in an exemplary embodiment of the present invention, and silicon has properties of high thermal conductivity, high electrical conductivity, being easily processed, and superior reliability operated under large current, operation performance of the light-emitting diode is effectively enhanced.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for manufacturing a high efficiency light-emitting diode, comprising:
   providing a growth substrate;
   forming a first conductivity type ohmic contact layer on the growth substrate;
   forming an illuminant epitaxial structure on the first conductivity type ohmic contact layer;
   forming a first electrode pad on the illuminant epitaxial structure;
   providing a temporary substrate;
   bonding the temporary substrate to the illuminant epitaxial structure and the first electrode pad;
   removing the growth substrate;
   forming a second ohmic contact metal layer on the side of the illuminant epitaxial structure opposite to the temporary substrate;
   forming a reflective metal layer on the second ohmic contact metal layer;
   providing a permanent substrate;
   bonding the permanent substrate to the reflective metal layer; and
   removing the temporary substrate,
   further comprising patterning the first conductivity type ohmic contact layer to expose a potion of the illuminant epitaxial structure.

2. The method for manufacturing a high efficiency light-emitting diode according to claim 1, wherein the illuminant epitaxial structure comprises a first conductivity type cladding layer, an active layer, a second conductivity type cladding layer and a transparent current-spreading layer.

3. The method for manufacturing a high efficiency light-emitting diode according to claim 1, wherein the first electrode pad comprises a first ohmic contact metal layer and a bonding metal pad stacked on the illuminant epitaxial structure in sequence.

4. The method for manufacturing a high efficiency light-emitting diode according to claim 3, wherein the first ohmic contact metal layer is selected from the group consisting of AuBe, AuZn and CrAu.

5. The method for manufacturing a high efficiency light-emitting diode according to claim 1, wherein the second ohmic contact metal layer is a compound material selected from the group consisting of AuGe/Au, Au/AuGe/Au and AuGe/Ni/Au.

6. The method for manufacturing a high efficiency light-emitting diode according to claim 1, wherein the reflective metal layer is selected from the group consisting of Au, Al, Ag, Cr and Ni.

7. The method for manufacturing a high efficiency light-emitting diode according to claim 1, wherein the step of bonding the temporary substrate comprises coating a first bonding layer on the illuminant epitaxial structure and the first electrode pad, and then adhering the temporary substrate to the first bonding layer.

8. The method for manufacturing a high efficiency light-emitting diode according to claim 1, wherein a bonding temperature of bonding the temporary substrate is between about 150° C. and about 500° C.

9. The method for manufacturing a high efficiency light-emitting diode according to claim 1, between the step of providing the growth substrate and the step of forming the illuminant epitaxial structure, further comprising forming an etching stop layer on the growth substrate.

10. The method for manufacturing a high efficiency light-emitting diode according to claim 1, between the step of forming the second ohmic contact metal layer on the illuminant epitaxial structure and the step of forming the reflective metal layer on the second ohmic contact layer, further comprising forming a transparent conductive oxide layer on the second ohmic contact metal layer; wherein the transparent conductive oxide layer is selected from the group consisting of $In_2O_3$, $SnO_2$, ZnO, ITO, CTO, $CuAlO_2$, $CuGaO_2$ and $SrCu_2O_2$.

11. The method for manufacturing a high efficiency light-emitting diode according to claim 1, between the step of forming the reflective metal layer and the step of providing the permanent substrate, further comprising forming a diffusion barrier layer to cover the reflective metal layer.

12. The method for manufacturing a high efficiency light-emitting diode according to claim 11, wherein the diffusion barrier layer is selected from the group consisting of Mo, Pt, W, ITO, ZnO, and MnO.

13. The method for manufacturing a high efficiency light-emitting diode according to claim 1, between the step of providing the permanent substrate and the step of bonding the permanent substrate, further comprising forming a first contact metal layer and a second contact metal layer to respectively cover two opposite surfaces of the permanent substrate, and forming a second bonding layer on the permanent substrate or on the reflective metal layer, wherein the first contact metal layer is located between the permanent substrate and the second bonding layer.

14. The method for manufacturing a high efficiency light-emitting diode according to claim 1, between the step of removing the growth substrate and the step of forming a second ohmic contact metal layer on the side of the illuminant epitaxial structure opposite to the temporary substrate, the step of patterning the first conductivity type ohmic contact layer to expose a portion of the illuminant epitaxial structure occurs.

15. The method for manufacturing a high efficiency light-emitting diode according to claim 1, wherein the first conductivity type ohmic contact layer is selected from the group consisting of GaAs, GaAsP, and AlGaInP.

16. The method for manufacturing a high efficiency light-emitting diode according to claim 1, wherein the growth substrate is selected from the group consisting of GaAs, InP, GaP, and sapphire.

17. The method for manufacturing a high efficiency light-emitting diode according to claim 1, wherein the permanent substrate is selected from the group consisting of Si, Ge, SiC, MN, Cu, Al, and sapphire.

18. The method for manufacturing a high efficiency light-emitting diode according to claim 1, wherein the second ohmic contact metal layer comprises AuGe.

* * * * *